United States Patent
Arnold et al.

(10) Patent No.: US 10,614,953 B2
(45) Date of Patent: Apr. 7, 2020

(54) MITIGATION OF CONTAMINATION OF ELECTROPLATED COBALT-PLATINUM FILMS ON SUBSTRATES

(71) Applicant: University of Florida Research Foundation, Gainesville, FL (US)

(72) Inventors: David P. Arnold, Gainesville, FL (US); Ololade D. Oniku, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 390 days.

(21) Appl. No.: 15/404,716

(22) Filed: Jan. 12, 2017

(65) Prior Publication Data

US 2017/0200546 A1    Jul. 13, 2017

Related U.S. Application Data

(60) Provisional application No. 62/277,669, filed on Jan. 12, 2016, provisional application No. 62/320,773, filed on Apr. 11, 2016.

(51) Int. Cl.
*H01F 41/32*    (2006.01)
*B81C 1/00*    (2006.01)
(Continued)

(52) U.S. Cl.
CPC .......... *H01F 41/32* (2013.01); *B81C 1/0038* (2013.01); *H01F 10/123* (2013.01); *H01F 10/30* (2013.01)

(58) Field of Classification Search
CPC ........ H01F 41/32; H01F 10/30; H01F 10/123; B81C 1/0038
See application file for complete search history.

(56) References Cited

U.S. PATENT DOCUMENTS 6,086,974 A    7/2000    Thiele et al.
6,248,416 B1    6/2001    Lambeth et al.
(Continued)

FOREIGN PATENT DOCUMENTS

EP    0140513    8/1984

OTHER PUBLICATIONS

Zana et al., Electrodeposition of Co—Pt Films with High Perpendicular Anisotropy, Electrochem. Solid-State Lett. 2003 vol. 6, issue 12, C153-C156.
(Continued)

*Primary Examiner* — Mohamad A Musleh
(74) *Attorney, Agent, or Firm* — Thomas | Horstemeyer, LLP

(57) ABSTRACT

Various embodiments to mitigate the contamination of electroplated cobalt-platinum films on substrates are described. In one embodiment, a device includes a substrate, a titanium nitride diffusion barrier layer formed upon the substrate, a titanium layer formed upon the titanium nitride diffusion barrier layer, a platinum seed layer, and a cobalt-platinum magnetic layer formed upon the platinum seed layer. Based in part on the use of the titanium nitride diffusion barrier layer and/or the platinum seed layer, improvements in the interfaces between the layers can be achieved after annealing, with less delamination, and with substantial improvements in the magnetic properties of the cobalt-platinum magnetic layer. Further, the cobalt-platinum magnetic layer can be formed at a relatively thin thickness of hundreds of nanometers to a few microns while still maintaining good magnetic properties.

20 Claims, 11 Drawing Sheets

(51) Int. Cl.
*H01F 10/30* (2006.01)
*H01F 10/12* (2006.01)

(56) References Cited

U.S. PATENT DOCUMENTS

| | | |
|---|---|---|
| 6,620,533 B2 | 9/2003 | Hikosaka et al. |
| 7,771,650 B2 | 8/2010 | Ng et al. |
| 2002/0164506 A1* | 11/2002 | Bian ............... B82Y 25/00 428/832 |
| 2003/0008178 A1* | 1/2003 | Bian ............... B82Y 25/00 428/832.2 |
| 2004/0191578 A1 | 9/2004 | Chen et al. |
| 2005/0186453 A1 | 8/2005 | Oh et al. |
| 2009/0231755 A1* | 9/2009 | Takahashi ............. G11B 5/65 360/110 |
| 2011/0062537 A1* | 3/2011 | Oh ................. B82Y 25/00 257/421 |
| 2014/0139952 A1* | 5/2014 | Takeo ................. G11B 5/1278 360/125.03 |
| 2014/0268301 A1* | 9/2014 | Ding .................. G02F 1/091 359/296 |
| 2015/0179925 A1* | 6/2015 | Tahmasebi ........... H01L 27/222 257/421 |

OTHER PUBLICATIONS

Wang et al., Nanostructured L10 Co—Pt thin films by an electrodeposition process, Electrochemistry Communications, vol. 6, Issue 11, Nov. 2004, pp. 1149-1152.

Oniku et al., Microfabrication of High-Performance Thick Co80Pt20 Permanent Magnets for Microsystems Applications, ECS Trans. 2013 vol. 50, issue 10, 167-174.

Oniku et al., Effect of Current Density on Electroplated CoPt Thick Films, Transducers 2015, Anchorage, Alaska, USA, Jun. 21-25, 2015.

* cited by examiner

MITIGATION OF CONTAMINATION OF ELECTROPLATED COBALT-PLATINUM FILMS ON SUBSTRATES

CROSS-REFERENCE TO RELATED APPLICATIONS

This application claims the benefit of U.S. Provisional Application No. 62/277,669, filed Jan. 12, 2016, and the benefit of U.S. Provisional Application No. 62/320,773, filed Apr. 11, 2016, the entire contents of both of which applications are hereby incorporated herein by reference.

GOVERNMENT LICENSE RIGHTS

This invention was made with government support under grant number IIP-1439644 awarded by the National Science Foundation. The government has certain rights in this invention.

BACKGROUND

Because of the advantages offered by electroplating, such as cost efficiency, ease of fabrication and scalability, shape controllability, and the ability to integrate with other micro-electro-mechanical system (MEMS) processes, the electrodeposition of cobalt-platinum (CoPt) permanent magnets has been widely studied as an attractive and practical fabrication technique for various MEMS applications.

Because most MEMS are built on substrates, it is also desirable to have a process to integrate CoPt permanent magnets onto substrates. Generally, however, a silicon substrate, for example, is not electrically conductive enough to use electroplating to form CoPt permanent magnets on the Si substrate, or there may be dielectric layers on the Si substrate which prevent the use of electroplating processes. Therefore, it is necessary and customary to use an electrically conductive seed layer (e.g., a copper (Cu) seed layer) onto which electroplated CoPt films can be deposited.

Once formed, CoPt layers require a high-temperature (e.g., between about 500-750° C.) heat treatment, such as an annealing treatment or step, to induce a phase transition for desirable magnetic properties. Unfortunately, this high temperature step creates a variety of challenges for the integration of CoPt permanent magnets on substrates.

BRIEF DESCRIPTION OF THE DRAWINGS

For a more complete understanding of the embodiments and the advantages thereof, reference is now made to the following description, in conjunction with the accompanying figures briefly described as follows.

Figure 1:
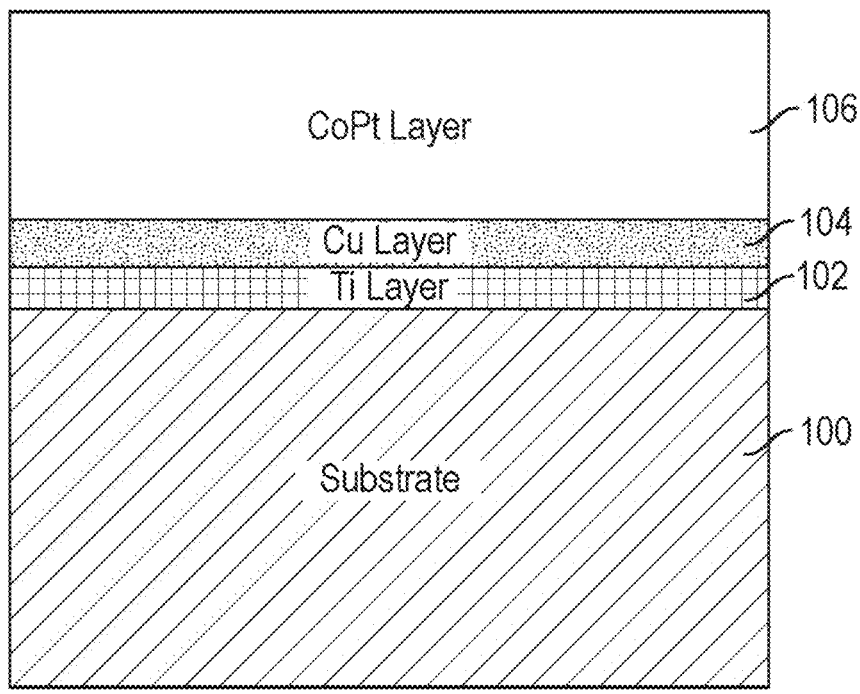
FIG. 1 illustrates an example device including a cobalt-platinum (CoPt) permanent magnet formed on a substrate according to an example embodiment described herein.

The drawings illustrate only example embodiments and are therefore not to be considered limiting of the scope of the embodiments described herein, as other embodiments are within the scope of this disclosure. The elements and features shown in the drawings are not necessarily drawn to scale, emphasis instead being placed upon clearly illustrating the principles of the embodiments. Additionally, certain dimensions or positionings may be exaggerated to help visually convey certain principles. In the drawings, similar reference numerals between figures designate like or corresponding, but not necessarily the same, elements.

DETAILED DESCRIPTION

Equiatomic cobalt-platinum (CoPt) in the ordered L10-phase is known to exhibit relatively strong magnetic properties (e.g., magnetocrystalline anisotropy constant (Ku)=4.9 MJ/m$^3$, $\mu_0 H_{ci} \geq 1$ T, and saturation magnetization ($M_s$)=1 T) and good corrosion resistance, making it a magnetic material of considerable interest in several fields, such as the power micro-electro-mechanical system (MEMS) community, among others. In the as-deposited state, a CoPt layer possesses a disordered A1 crystallographic phase, with relatively soft magnetic properties (e.g., $\mu_0 H_{ci} < 0.0125$ T, squareness or remanence/saturation magnetization ($M_r/M_s$)<0.05). A thermal annealing process step at a relatively high temperature (e.g., usually >500° C.) can be used to induce a crystallographic ordering in the CoPt layer from the disordered A1 phase with a face-centered cubic structure to an ordered L10 equilibrium phase having a face-centered tetragonal structure. The tetragonal crystal lattice yields high magnetocrystalline anisotropy and plays a key role in yielding hard CoPt permanent magnets.

Because most MEMS are built on substrates, it would be desirable to have a reliable and robust process to integrate CoPt permanent magnets onto substrates. Some substrates, however, are not electrically conductive enough to use an electroplating process to form CoPt permanent magnets onto them, or there may be other dielectric layers on the substrates which prevent the use of electroplating processes. Therefore, it is necessary and customary to use an electrically conductive seed layer, such as a copper (Cu) seed layer, onto which electroplated CoPt layers or films can be deposited.

However, as noted above, electroplating is a variation-prone process, in that factors such as plating conditions (e.g., pH levels, current characteristics, temperature, agitation, deposition time), electrolyte composition, substrate or seed layer type and/or composition impact the morphology and overall properties of the plated layer. For example, an investigation of the influence of current density, seed layer, and anneal temperature/time on the crystallographic structure and magnetic properties of 3-20 μm-thick electroplated CoPt magnets has identified process-induced variations.

While studies have focused on multi-micron thick CoPt magnets, CoPt magnets having thicknesses of hundreds of nanometers to a few microns may be desired for certain micro device and system applications. The effects of thickness variation on the magnetic properties of electroplated CoPt magnets, and particularly an unexpected reduction in magnetic properties observed in CoPt magnets having a thickness of less than about 3 μm, are described herein. The deterioration in the magnetic properties of CoPt magnets having thicknesses less than 3 μm on Si substrates is identified to be the result of various factors, including (a) metal-silicide reactions between the metal seed layers or CoPt layers with Si substrates and (b) inter-diffusion of the metal seed layers with the CoPt layers, both of which occur during annealing. The use of a diffusion barrier, such as a TiN diffusion barrier, between the silicon and reactive metals is shown to eliminate the silicide reaction and thereby improve the magnetic properties of thinner electroplated CoPt magnets. However, inter-diffusion between the seed layer or diffusion barrier with the CoPt layer still remains. To further improve the magnetic properties of thinner electroplated CoPt layers, seed layers other than copper, such as cobalt Co and platinum Pt, for example, can be used as described herein. In other embodiments, the CoPt layers may be deposited directly onto a suitable diffusion barrier, so long as the diffusion barrier is electrically conductive enough for electroplating.

Turning to the drawings, FIG. 1 illustrates an example device 10 including a CoPt permanent magnet formed on a substrate. The device 10 includes a substrate 100, a titanium (Ti) layer 102, a Cu layer 104, and a CoPt layer 106. The substrate 100, Ti layer 102, Cu layer 104, and CoPt layer 106 are not necessarily drawn to scale in FIG. 1.

The device 10 is provided as a representative example of a structure through which a CoPt permanent magnetic layer can be formed, through electroplating the CoPt layer 106 upon the Cu layer 104, but is not intended to be limiting as other structures are within the scope of the embodiments. The method by which the device 10 (and other devices described herein) can be manufactured, including electroplating and annealing the CoPt layer 106, is described in further detail below with reference to FIG. 10. It should also be appreciated that other layers can be deposited upon the CoPt layer 106 in certain cases as described below.

The substrate 100 can be embodied as any material or combination of materials suitable for use as a supporting substrate for the devices described herein. As non-limiting examples, the substrate 100 can be embodied as a single crystal silicon or a silicon compound, such as 100, 110, or 111-oriented single crystal silicon, polycrystalline silicon, silicon dioxide, silicon carbide, or silicon nitride, or combinations thereof, germanium, gallium arsenide, quartz, ceramic or ceramic compounds, glass, polymers or conductive polymers, or any combinations thereof. In some cases, the substrate 100 may also include one or more films on its surface, such as silicon oxide, silicon dioxide, silicon carbide, polysilicon, aluminum, copper, gold, or any combinations thereof.

Consistent with the example structure of the device 10 shown in FIG. 1, CoPt layers with thicknesses ranging from 0.5 μm to 5 μm were deposited into photoresist-defined molds (i.e., 3.5 mm×3.5 mm square and 5 μm×50 μm arrays) on a (100)-oriented Si substrate coated with a 10 nm Ti adhesion layer and a 100 nm Cu seed layer. The resulting structures showed an unexpected reduction in magnetic properties for the CoPt layers less than about 2-3 μm thick. This effect may be a consequence of metal-silicide reactions that occur at the substrate Ti/Cu interface during annealing, leading to the formation of a non-magnetic layer at the interface.

Figure 2:
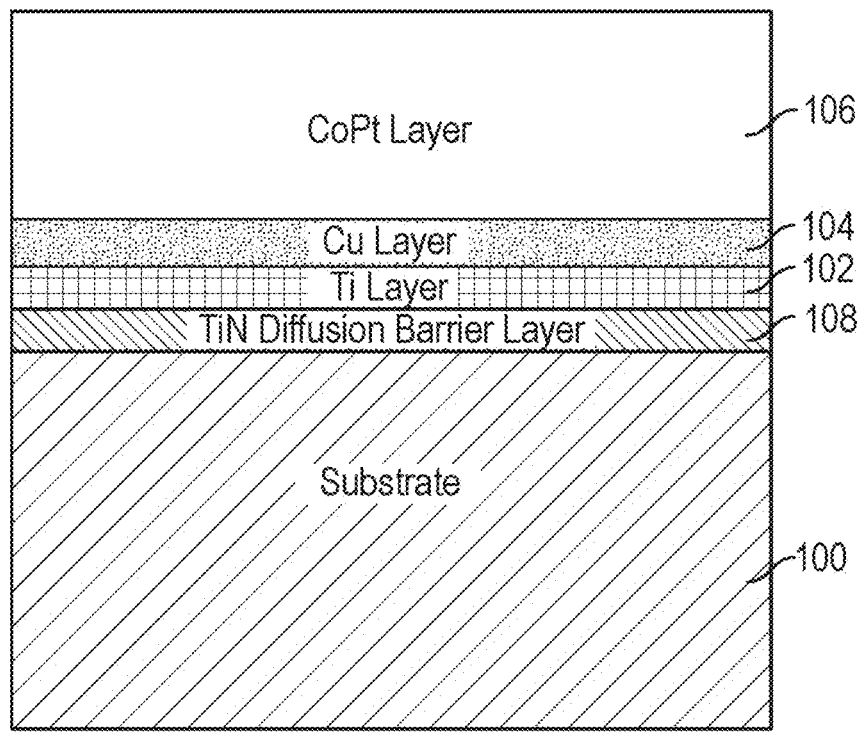
FIG. 2 illustrates an example device including a CoPt permanent magnet formed on a substrate having a titanium nitride (TiN) diffusion barrier layer according to an example embodiment described herein.

To address the unexpected reduction in magnetic properties for CoPt layers less than about 2-3 μm thick, a TiN diffusion barrier layer was added to inhibit the silicide reaction and thereby maintain strong magnetic properties (e.g., $H_{ci}$ of about 800 kA/m, $M_r/M_s=0.8$) in micron-thick electroplated CoPt layers. In that context, FIG. 2 illustrates an example device 20 including a CoPt permanent magnet formed on a substrate having a TiN diffusion barrier layer. The device 20 includes the substrate 100, a TiN diffusion barrier layer 108, the Ti layer 102, the Cu layer 104, and the CoPt layer 106. Again, the device 20 is not necessarily drawn to scale. The device 20 is provided as a representative example of a structure through which a CoPt permanent magnetic layer can be formed, through electroplating the CoPt layer 106 upon the Cu layer 104, but is not intended to be limiting as other structures are within the scope of the embodiments. The method by which the device 20 (and other devices described herein) can be manufactured, including electroplating and annealing the CoPt layer 106, is described in further detail below with reference to FIG. 10. It should also be appreciated that other layers can be deposited upon the CoPt layer 106 in certain cases as described below.

Consistent with the example structures of the device 20 shown in FIG. 2, CoPt layers were electroplated into photoresist-defined molds (i.e., 3.5 mm×3.5 mm square and 5 μm×50 μm arrays) on a (100)-oriented Si substrate using one of two types of seed layers. Type A samples used a 10 nm Ti adhesion layer and a 100 nm Cu conductive layer. Type B samples used a TiN diffusion barrier layer, followed by a 10 nm Ti adhesion layer and a 100 nm Cu conductive layer. The TiN diffusion barrier layer was achieved by reactive sputtering of Ti in nitrogen, and the Ti adhesion and Cu seed layers were direct current sputtered. The electroplating bath for the CoPt layer consisted of 0.1 M of cobalt sulfamate, 0.025 M of diamine dinitrito platinum (II), and 0.1 M of ammonium citrate salts in a 100 mL solution. CoPt layers were plated at room temperature, at a pH of 7 using 100 mA/cm2 currents and subsequently annealed in a forming gas ambient (4% H2+96% N2) at 700° C. with a ramp rate of 20° C./min for 40 mins. CoPt layers of various thicknesses between ~0.5 μm and ~5 μm were obtained by varying the deposition time. Table 1 presents the deposition time and corresponding film thickness for samples A1-A5 and B1-B3.

TABLE 1

Deposition times and film thickness of electroplated CoPt.

| Sample | Layers | Deposition Time (min) | Film Thickness (μm) |
|---|---|---|---|
| A1 | Si/Ti/Cu | 5 | 0.4 |
| A2 | Si/Ti/Cu | 15 | 1.3 |

TABLE 1-continued

Deposition times and film thickness of electroplated CoPt.

| Sample | Layers | Deposition Time (min) | Film Thickness (μm) |
|---|---|---|---|
| A3 | Si/Ti/Cu | 30 | 2.6 |
| A4 | Si/Ti/Cu | 45 | 3.5 |
| A5 | Si/Ti/Cu | 60 | 5.2 |
| B1 | Si/TiN/Ti/Cu | 5 | 0.4 |
| B2 | Si/TiN/Ti/Cu | 15 | 1.3 |
| B3 | Si/TiN/Ti/Cu | 30 | 2.6 |

Energy dispersive x-ray spectroscopy (EDS) was used to confirm the chemical composition of the CoPt films, and an FEI Nova NanoSEM 430 scanning electron microscope (SEM) was used to image the films and to measure the film thickness. Crystallographic structure analysis was carried out using x-ray diffraction (XRD) patterns from a Panalytical X'Pert Powder diffractometer. In-plane and out-of-plane magnetic measurements were made with an ADE EV9 vibrating sample magnetometer (VSM).

Figure 3:
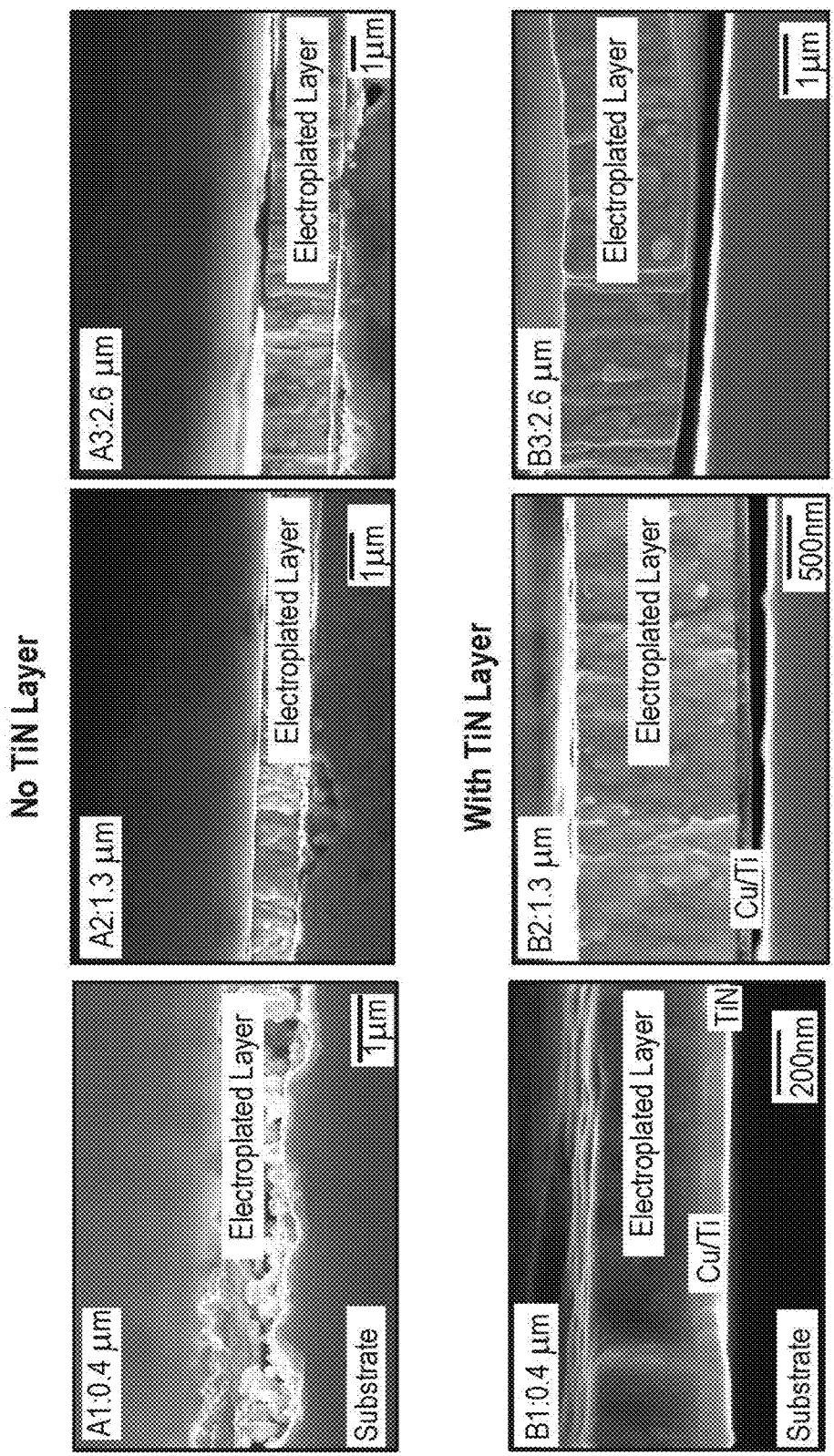
FIG. 3 shows example cross-section scanning electron microscope images of the CoPt magnets deposited into photoresist-defined molds with different thicknesses after annealing according to examples described herein.

FIG. 3 shows example cross-section SEM images of the CoPt magnets deposited into the photoresist-defined molds with different thicknesses after annealing according to examples described herein. Images of samples A1-A3 and B1-B3, corresponding to those identified in Table 1, are shown in FIG. 3. For samples without a TiN layer (i.e., Type A samples A1-A3), a rough, pulverized appearance of the metal-substrate interface is observed, particularly in the 0.4 μm-thick film of the A1 sample. As confirmed by XRD, this damaged interface is a consequence of a metal-silicide reaction between the Si substrate and the TiN/Cu layers at temperatures≥200° C. As the film thickness increases, the effects of the metal-silicide reactions become less noticeable and the microstructure of the CoPt layer becomes clearly defined. This trend was also observed in samples A4 and A5 (not shown in FIG. 3) with film thickness of 3.5 μm and 5.2 μm, respectively.

To mitigate the silicide reaction, a 25-nm TiN layer was used (refer to Type B samples in Table 1 and the structure shown in FIG. 2). The use of the TiN layer shows a significant improvement. An improvement of the Si substrate/TiN/Cu layer interface is observed as shown for the Type B samples in FIG. 3. However, a new problem arises in the poorer adhesion of the electroplated CoPt layer to the Cu seed layer. Particularly, the larger 3.5 mm×3.5 mm layers delaminated, but the smaller 5 μm×50 μm layers did not.

Figure 4:
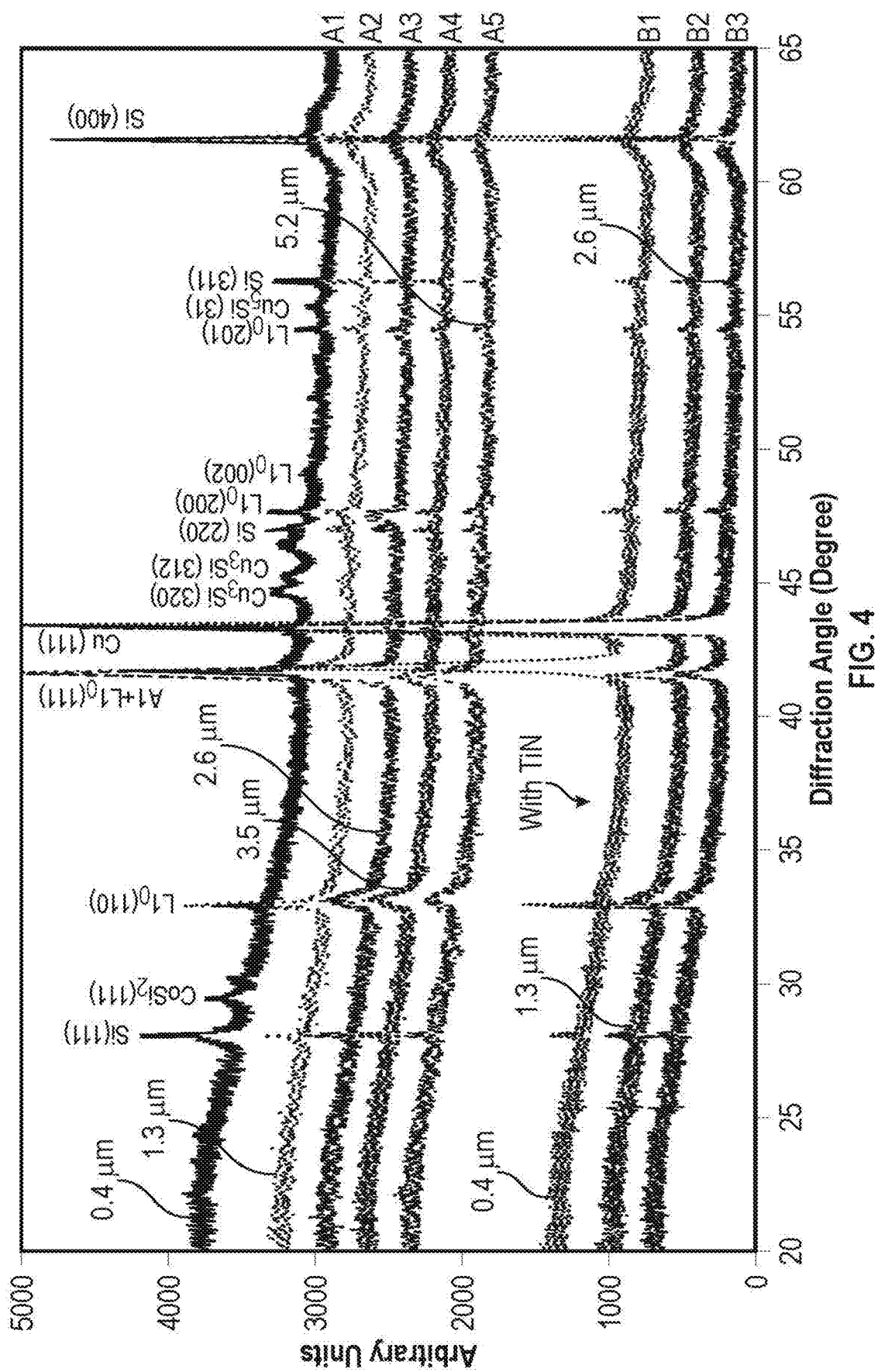
FIG. 4 shows x-ray diffraction (XRD) measurements for CoPt layer samples with different film thicknesses according to examples described herein.

FIG. 4 shows XRD measurements for CoPt layer samples with different film thicknesses according to examples described herein. The diffraction patterns confirm the presence of Co- and Cu-silicides in the Type A samples, with strong peak intensities for the 0.4 μm-thick sample without TiN. FIG. 4 also confirms the elimination of the silicides in the Type B samples with the introduction of the TiN barrier layer.

Figure 5:
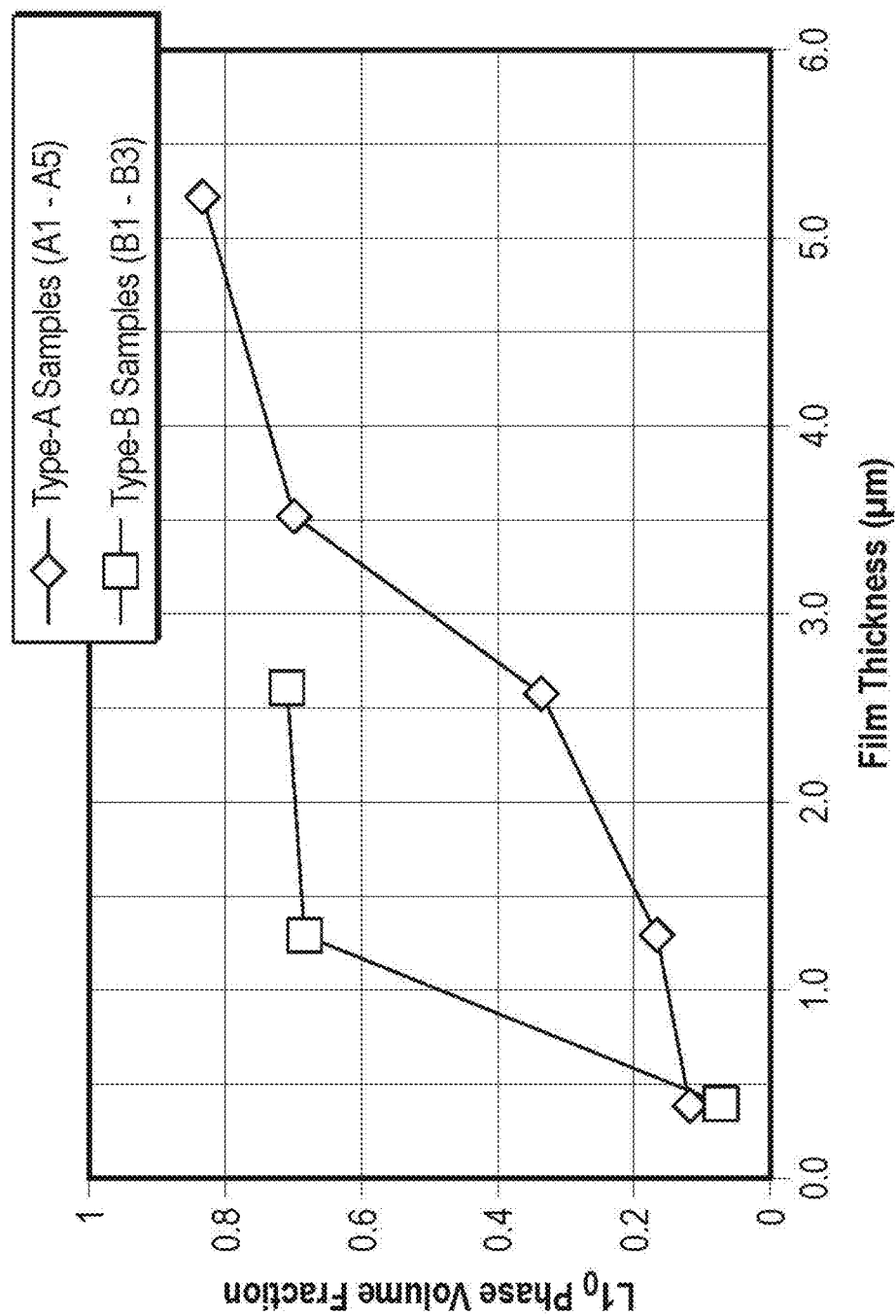
FIG. 5 shows the average grain size and the L10 phase volume fraction for CoPt layer samples according to examples described herein.

FIG. 5 shows the average grain size and the L10 phase volume fraction for CoPt layer samples A1-A5 (with TiN) and B1-B3 (without TiN). An increase in the L10 volume fraction is observed with increasing film thickness for both sets of samples. The low volume fraction obtained in the thinner films is attributed to the formation of metal silicides from interface reactions, inhibiting the progress of the transformation for the Type A samples, and a contamination of the CoPt magnetic film by the Cu seed layer for the Type B samples.

Figure 6A:
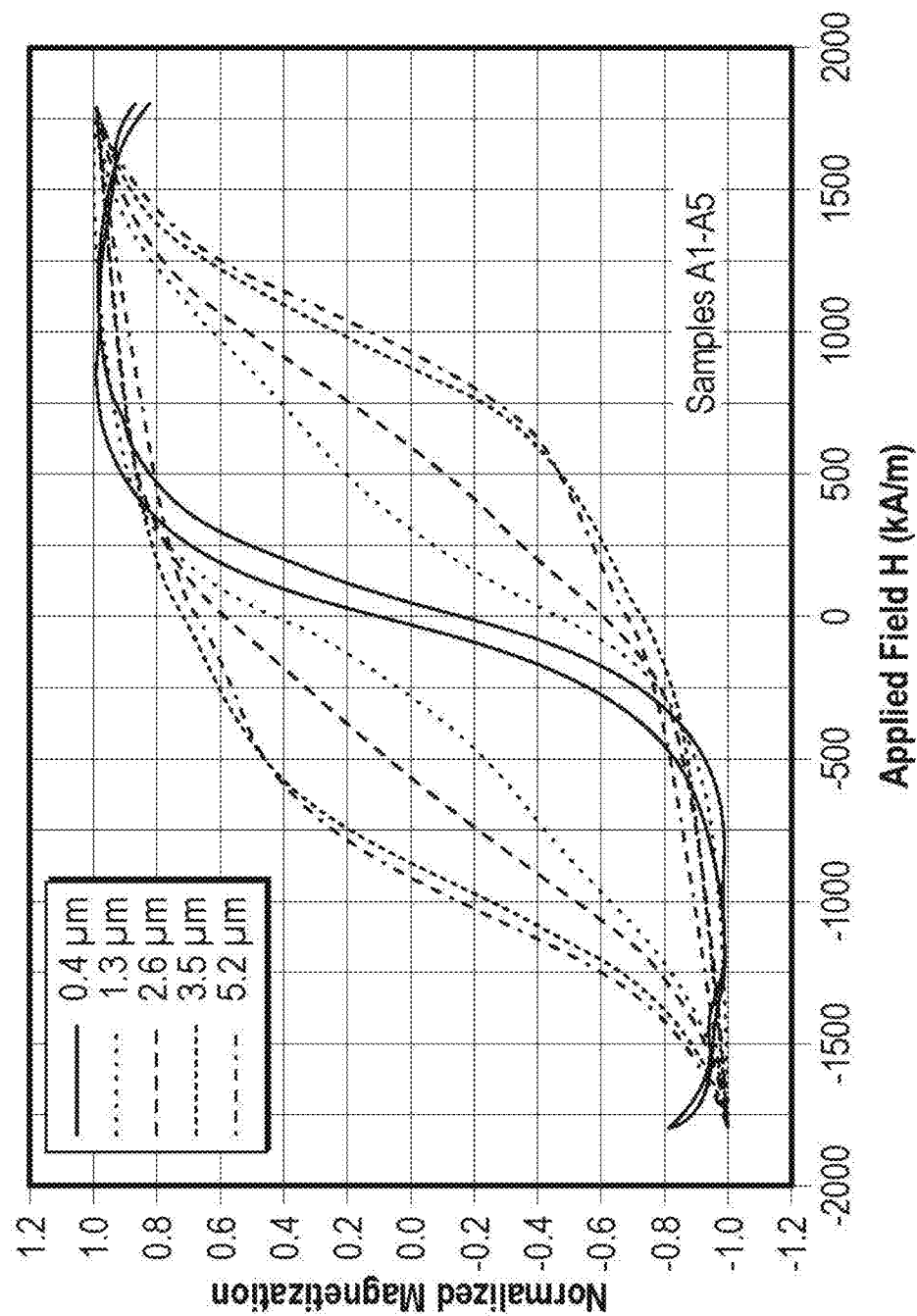
FIGS. 6A and 6B present out-of-plane magnetization curves for CoPt layer samples deposited with and without a TiN layer, respectively, according to examples described herein.
Figure 6B:
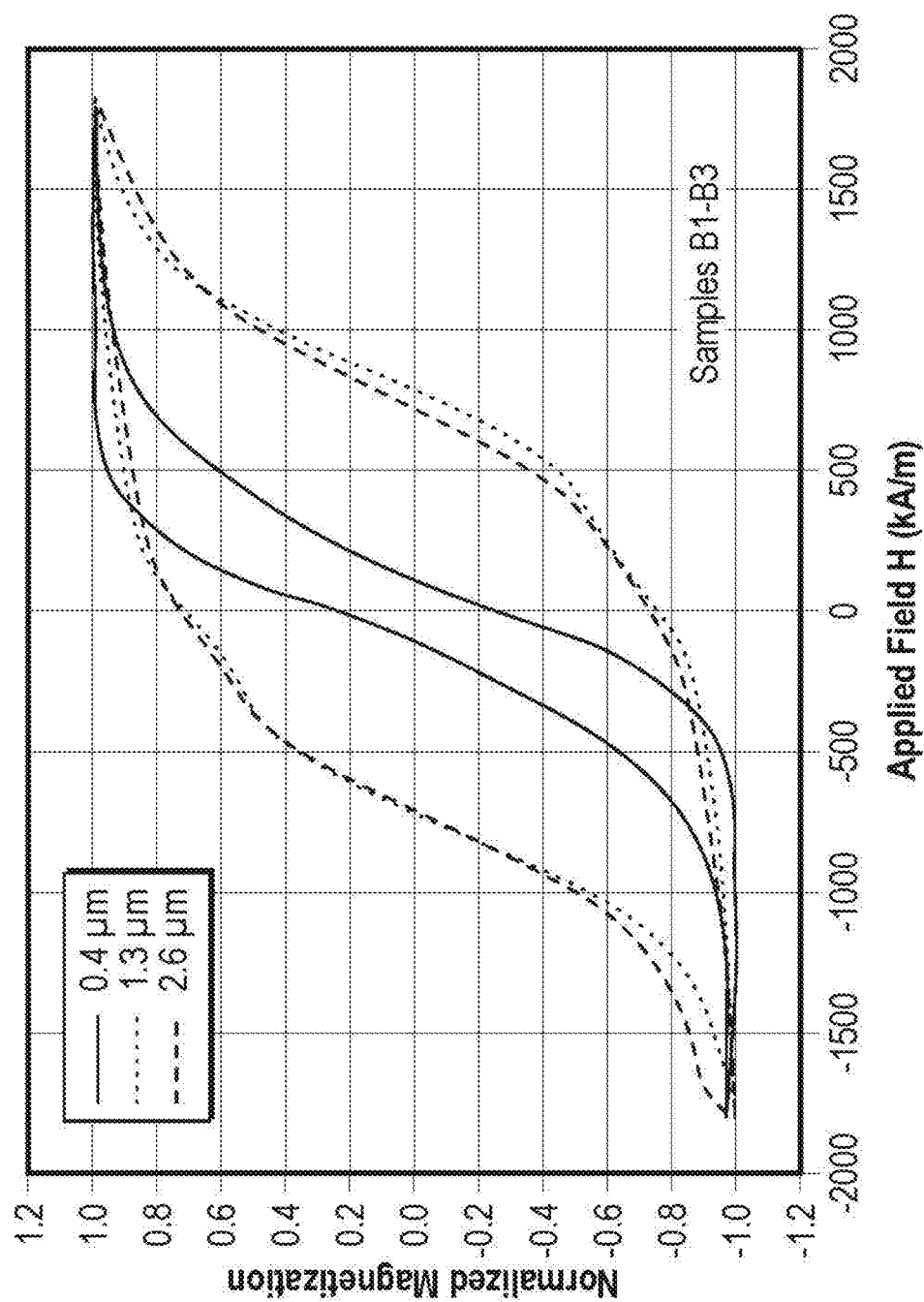

FIGS. 6A and 6B present out-of-plane magnetization curves for CoPt layer samples deposited with and without a TiN layer, respectively. In FIG. 6A, relatively poor magnetic properties are exhibited by the 0.4 μm-thick sample without a TiN layer, owing to the large volume fraction of non-magnetic silicides. The magnetic properties improve with thickness suggesting the existence of a "good" magnetic layer on top of a "poor" layer. Films at 3.5 μm and above show properties consistent with previously-reported 3 to 20 μm-thick layers. As shown in FIG. 6B, substantial improvements in magnetic properties are also observed for the samples including a TiN layer, especially those with film thicknesses of 1.3 μm and above, although the 0.4 μm-thick film still exhibits relatively poor magnetic properties which may be attributed to the aforementioned contamination of the CoPt magnetic layer by the Cu seed layer during annealing.

Figure 7:
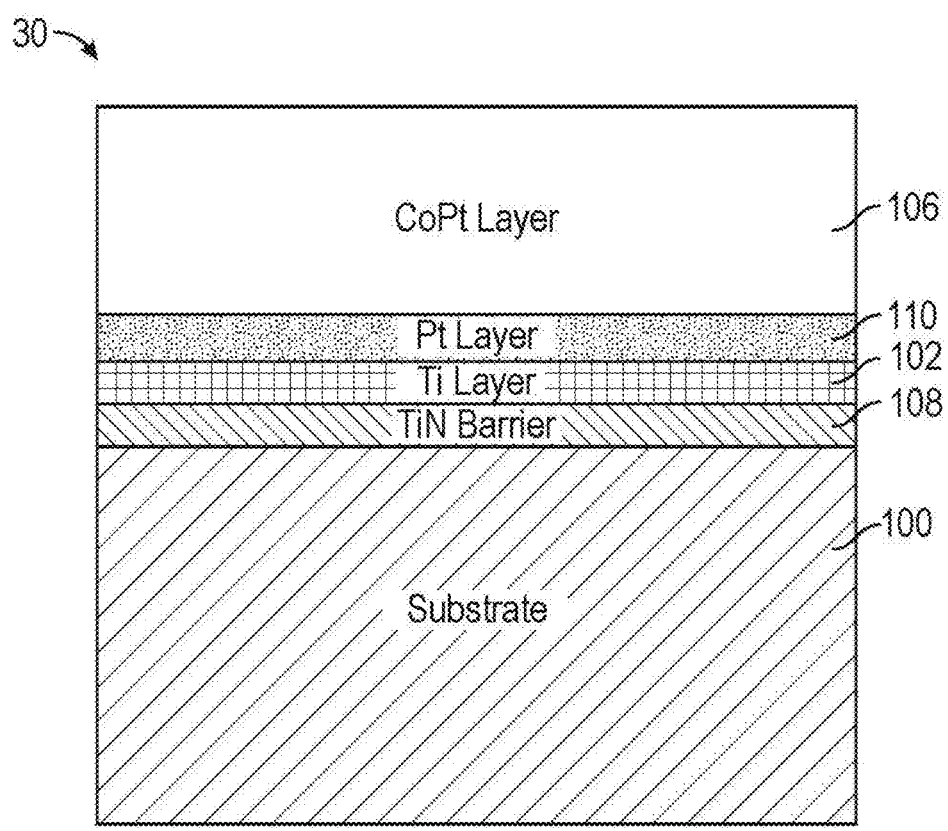
FIG. 7 illustrates an example device including a CoPt permanent magnet formed on a substrate having a TiN barrier layer and platinum (Pt) seed layer according to an example embodiment described herein.

To address the contamination of the CoPt magnetic layer by the Cu seed layer during annealing, seed layers other than copper, such as cobalt Co and platinum Pt, for example, can be used. In that context, FIG. 7 illustrates an example device 30 including a CoPt permanent magnet formed on a substrate having a TiN barrier layer and a Pt seed layer according to an example embodiment described herein. As compared to the device 20 in FIG. 2, the device 30 includes a Pt layer 110 rather than the Cu layer 104. The device 30 is not necessarily drawn to scale. The device 30 is provided as a representative example of a structure through which a CoPt permanent magnetic layer can be formed, through electroplating the CoPt layer 106 upon the Pt layer 110, but is not intended to be limiting as other structures are within the scope of the embodiments. The method by which the device 30 can be manufactured is described in further detail below with reference to FIG. 10.

Figure 8A:
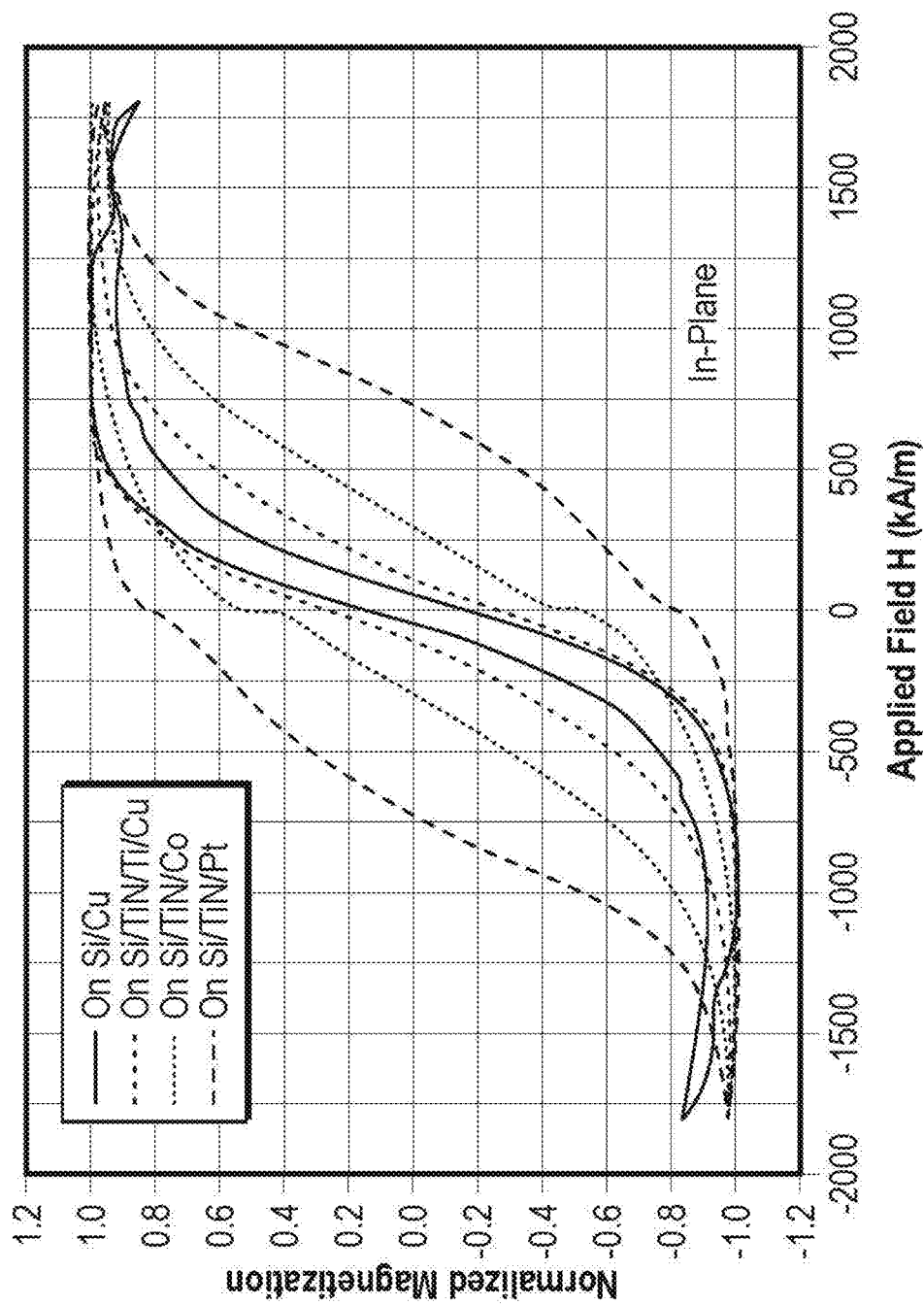
FIGS. 8A and 8B present in-plane and out-of-plane magnetization curves for 0.4 µm-thick CoPt layer samples deposited, respectively, upon Cu, Co, and Pt seed layers according to examples described herein.
Figure 8B:
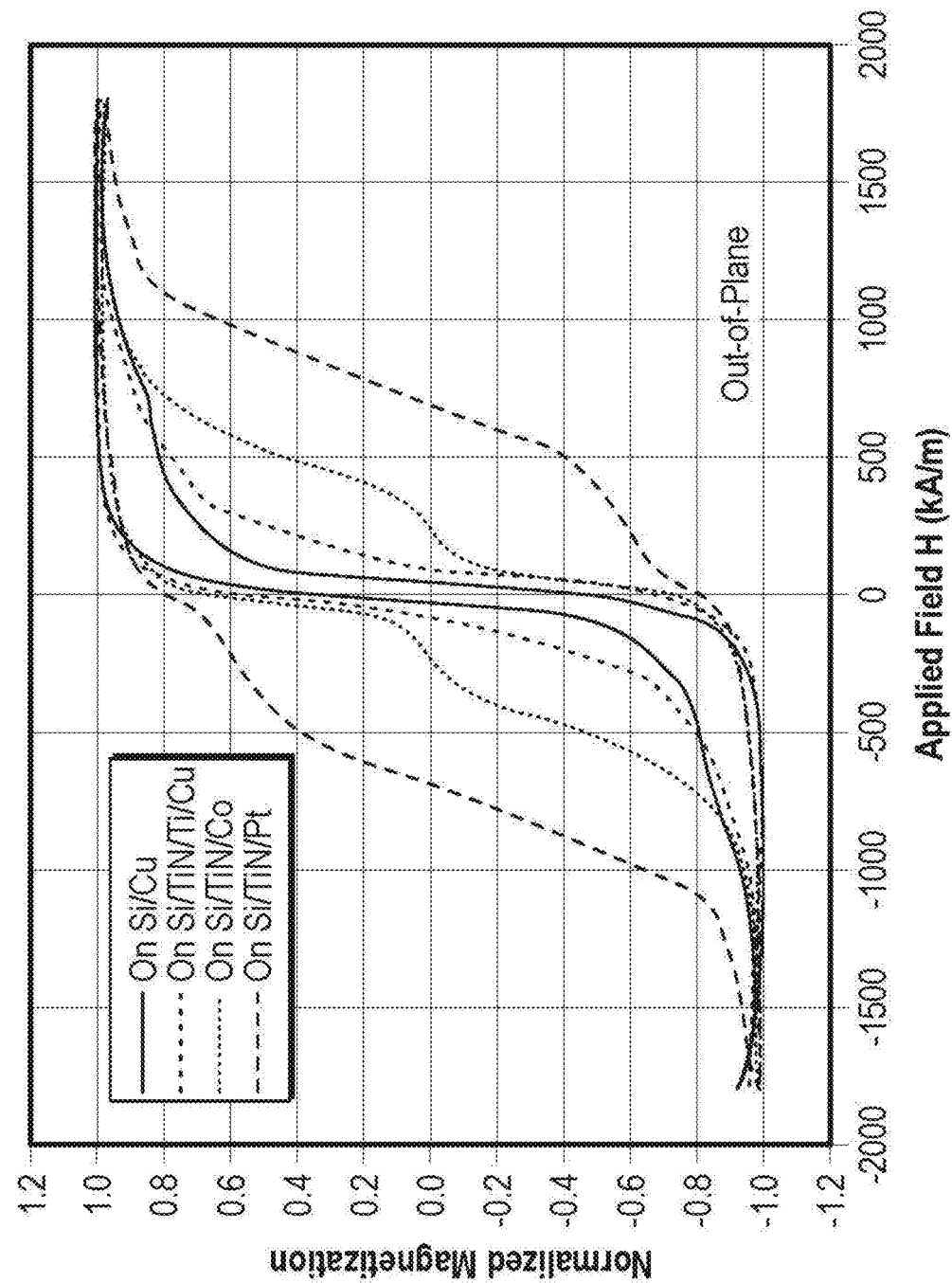

FIGS. 8A and 8B present in-plane out-of-plane magnetization curves for 0.4 μm-thick CoPt layer samples, respectively, deposited upon Cu, Co, and Pt seed layers. As shown, the magnetic properties are improved with the use of the Co seed layer and further improved with the use of the Pt seed layer, for both the in-plane out-of-plane magnetization curves. As compared to the results shown in FIGS. 6A and 6B, the magnetic properties are improved as compared to a Cu seed layer for both the Co and Pt seed layers. Additionally, the magnetic properties improve with thickness beyond 0.4 μm-thick CoPt layers. Thus, the use of seed layers other than copper, such as Co and Pt seed layers, for example, reduce the contamination of the CoPt magnetic layer during annealing. Particularly, the use of seed layers other Cu can provide a greater than two times increase in coercivity and about a two times increase in squareness. In other embodiments, other platinum-group elements, such as Palladium (Pd), Ruthenium (Ru), Rhodium (Rh), Osmium (Os), or Iridium (Ir) seed layers may be used in place of Cu. Among the embodiments, metals that inter-diffuse more slowly with the CoPt may be preferable as seed layers to those that diffuse more quickly.

Figure 9:
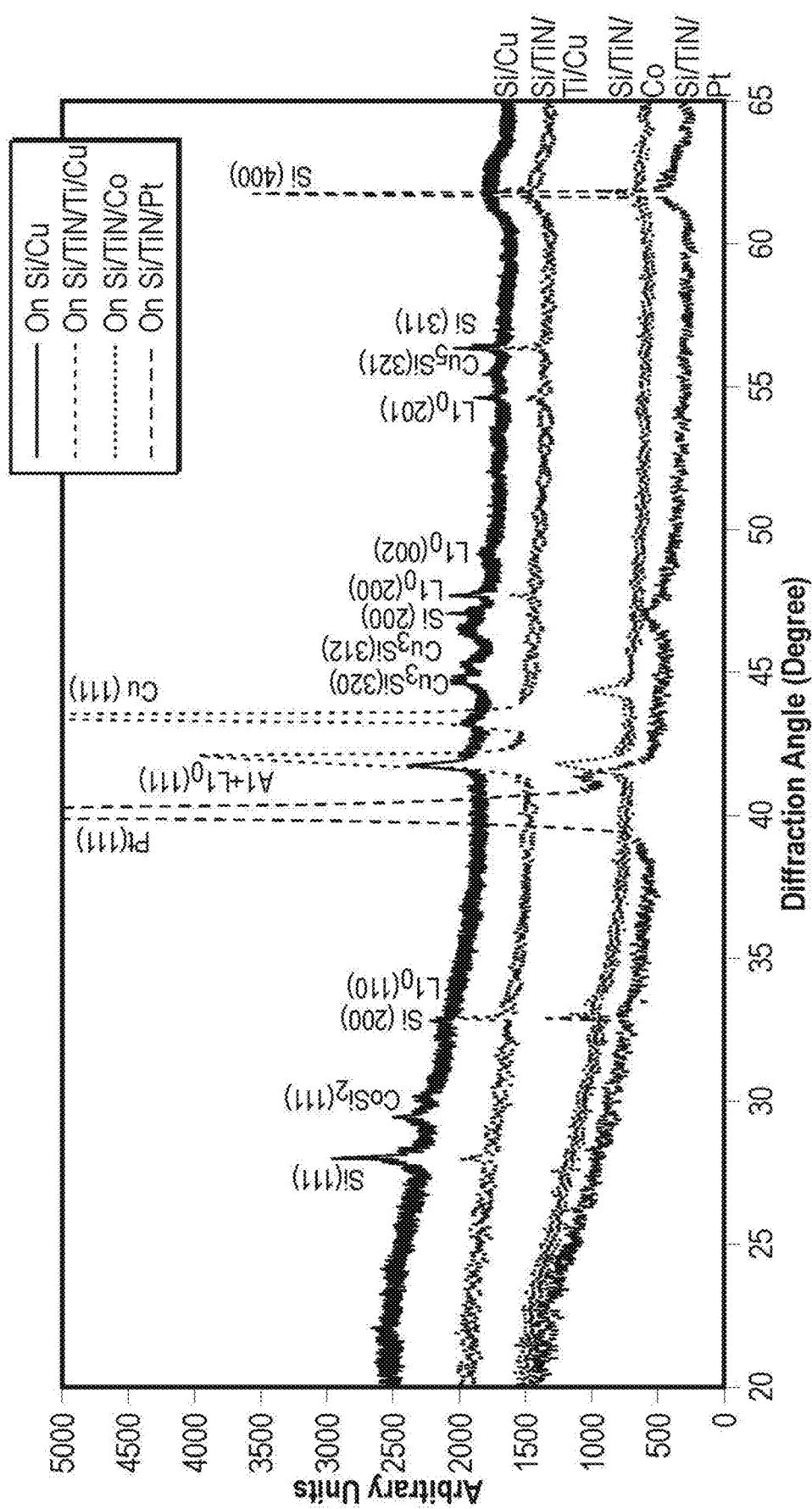
FIG. 9 shows XRD measurements for CoPt layer samples with different barrier and/or seed layers according to examples described herein.

FIG. 9 shows XRD measurements for CoPt layer samples with different barrier and/or seed layers according to examples described herein. The diffraction patterns confirm the elimination of Si (e.g., when a Si substrate is used) by using the TiN barrier layer. The diffraction patterns also show that there are no (or minimal) crystals of face-centered cubic (FCC) Co within the CoPt layer when deposited on a Pt seed layer. FCC Co in the CoPt layer reduces the overall coercivity of the CoPt layer. Thus, the elimination of FCC Co in the CoPt layer, as much as possible, is desired.

Figure 10:
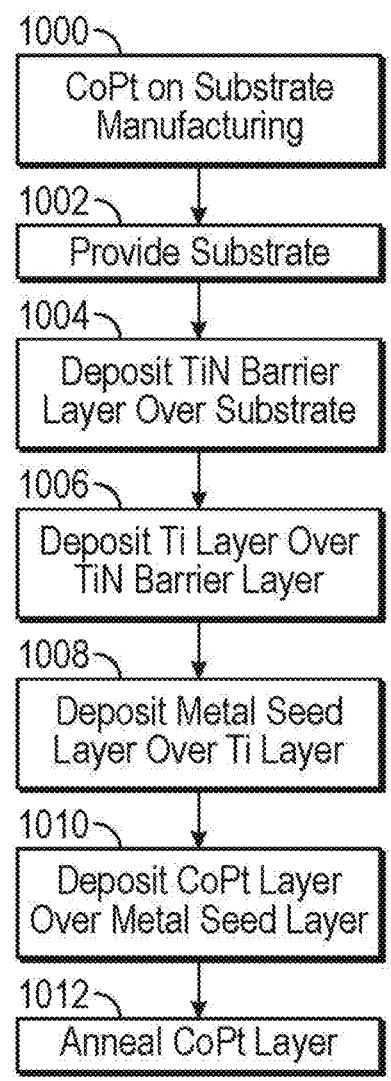
FIG. 10 shows a process for the manufacture of a CoPt permanent magnet on a substrate according to an example embodiment described herein.

FIG. 10 shows a process for the manufacture of a CoPt permanent magnet on a substrate according to an example embodiment described herein. At reference numeral 1002, the process includes providing a substrate. Any suitable substrate can be relied upon among the embodiments, including a single crystal silicon or a silicon compound, such as 100, 110, or 111-oriented single crystal silicon, polycrystalline silicon, silicon dioxide, silicon carbide, or silicon nitride, or combinations thereof, germanium, gallium arsenide, quartz, ceramic or ceramic compounds, glass, polymers or conductive polymers, or any combinations thereof. In some cases, the substrate can include one or more films on its surface, such as silicon oxide, silicon dioxide, silicon carbide, polysilicon, aluminum, copper, gold, or any combinations thereof.

At reference numeral 1004, the process includes depositing a TiN barrier layer over the substrate. The TiN barrier layer can be deposited over the substrate in any suitable way, such as by using a physical vapor deposition process. For example, the TiN barrier layer can be deposited by evaporation or sputtering of Ti in an atmosphere of nitrogen. The TiN barrier layer can be deposited at a thickness of about 25 nm, although other thicknesses are within the scope of the embodiments. In some embodiments, the TiN barrier layer can be omitted, in which case the step at reference numeral 1004 can be skipped.

At reference numeral 1006, the process includes depositing a Ti layer over the TiN barrier layer. The Ti layer can be deposited in any suitable way, such as by using evaporation or sputtering of Ti in a vacuum. The Ti layer can be deposited at a thickness of about 10 nm, although other thicknesses are within the scope of the embodiments. At reference numeral 1008, the process includes depositing a metal seed layer over the Ti layer. The metal seed layer can be deposited in any suitable way, such as by using evaporation or sputtering of the metal in a vacuum. The metal seed layer can be deposited at a thickness of about 100 nm, although other thicknesses are within the scope of the embodiments. A Cu metal seed layer can be deposited at reference numeral 1006. However, to avoid the contamination of the CoPt magnetic layer, which is deposited over the metal seed layer at reference numeral 1010, by Cu during annealing, seed layers other than CU, such as Co and Pt, for example, can be used. In other embodiments, Ru or Ir seed layers can be used as metal seed layers. In general, metals which diffuse more slowly may be preferable to those that diffuse more quickly as seed layers among the embodiments.

At reference numeral 1010, the process includes depositing a CoPt magnetic layer over the metal seed layer. The CoPt magnetic layer can be deposited through electroplating, for example, or another suitable method. An electroplating bath consisting of about 0.1 M of cobalt sulfamate, 0.025 M of diamine dinitrito platinum (II), and 0.1 M of ammonium citrate salts in a 100 mL solution, for example, can be used for electroplating the CoPt magnetic layer, although other bath compositions can be used. The CoPt magnetic layer can be electroplated at room or other temperatures, at a pH of about 7 using 100 mA/cm2 or any other suitable pH and current. As described herein, based in part on the use of the TiN barrier layer and/or the Co or Pt metal seed layers, the CoPt magnetic layer can be formed at a relatively thin thickness of hundreds of nanometers to a few microns while still maintaining good magnetic properties.

At reference numeral 1012, the process includes annealing the CoPt magnetic layer. The CoPt magnetic layer can be annealed in a suitable forming gas at a suitable temperature and ramp rate for a period of time to induce a crystallographic ordering in the CoPt magnetic layer from the disordered A1 phase with a face-centered cubic structure to an ordered L10 equilibrium phase having a face-centered tetragonal structure. Again, based in part on the use of the TiN barrier layer and/or the Co or Pt metal seed layers, an improvement of the substrate/TiN/Ti/metal seed layer interface can be achieved after annealing, without (or with less) delamination, and with substantial improvements in the magnetic properties of the CoPt magnetic layer. Additional layers can also be deposited upon the CoPt magnetic layer for building MEMS devices, for example, or for other reasons.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

At least the following is claimed:

1. A device, comprising:
    a substrate;
    a diffusion barrier formed over the substrate;
    a seed layer formed over the diffusion barrier, wherein the seed layer comprises at least one of platinum, cobalt, palladium, ruthenium, rhodium, osmium, or iridium; and
    a cobalt-platinum magnetic layer formed upon the seed layer.

2. The device according to claim 1, wherein the cobalt-platinum magnetic layer is formed upon the seed layer at a thickness of less than about three microns through an electroplating process.

3. The device according to claim 1, further comprising an adhesion layer formed upon the diffusion barrier and between the diffusion barrier and the seed layer.

4. The device according to claim 1, wherein the diffusion barrier is formed upon the substrate.

5. The device according to claim 4, wherein the diffusion barrier comprises at least one of titanium nitride, tantalum nitride, tungsten nitride, indium oxide, nickel, tantalum, halfnium, niobium, zirconium, vanadium, or tungsten.

6. The device according to claim 4, wherein:
    the cobalt-platinum magnetic layer is electroplated upon the seed layer and annealed to induce a crystallographic ordering of the cobalt-platinum magnetic layer from a disordered phase to an ordered equilibrium phase; and
    the diffusion barrier inhibits a reaction at an interface between the substrate and the seed layer as the cobalt-platinum magnetic layer is annealed to induce the ordered equilibrium phase.

7. The device according to claim 1, wherein the substrate comprises at least one of 100, 110, or 111-oriented single crystal silicon.

8. The device according to claim 1, wherein the substrate comprises at least one of single crystal silicon, silicon compound, polycrystalline silicon, silicon dioxide, silicon carbide, silicon nitride.

9. The device according to claim 1, wherein the substrate comprises at least one of germanium, gallium arsenide, quartz, or ceramic compound.

10. A device, comprising:

a substrate;

a diffusion barrier formed over the substrate, wherein the diffusion barrier comprises at least one titanium nitride, tantalum nitride, tungsten nitride, indium oxide, nickel, tantalum, halfnium, niobium, zirconium, vanadium, or tungsten;

a seed layer formed over the diffusion barrier, wherein the seed layer comprises at least one of platinum, cobalt, palladium, ruthenium, rhodium, osmium, or iridium; and a cobalt-platinum magnetic layer formed over the diffusion barrier.

11. The device according to claim 10, wherein the cobalt-platinum magnetic layer is formed upon the seed layer at a thickness of less than about three microns through an electroplating process.

12. The device according to claim 10, further comprising an adhesion layer formed upon the diffusion barrier and between the diffusion barrier and the seed layer.

13. The device according to claim 10, wherein:

the cobalt-platinum magnetic layer is electroplated upon the seed layer and annealed to induce a crystallographic ordering of the cobalt-platinum magnetic layer from a disordered phase to an ordered equilibrium phase; and the diffusion barrier inhibits a reaction at an interface between the substrate and the seed layer as the cobalt-platinum magnetic layer is annealed to induce the ordered equilibrium phase.

14. The device according to claim 10, wherein the substrate comprises at least one of 100, 110, or 111-oriented single crystal silicon.

15. A device, comprising:

a substrate;

a diffusion barrier formed upon the substrate, wherein the diffusion barrier comprises at least one of titanium nitride, tantalum nitride, tungsten nitride, indium oxide, nickel, tantalum, halfnium, niobium, zirconium, vanadium, or tungsten;

a seed layer formed over the diffusion barrier; and a cobalt-platinum magnetic layer formed upon the seed layer.

16. The device according to claim 15, further comprising an adhesion layer formed upon the diffusion barrier and between the diffusion barrier and the seed layer.

17. The device according to claim 15, wherein:

the cobalt-platinum magnetic layer is formed upon the seed layer at a thickness of less than about three microns through an electroplating process;

the cobalt-platinum magnetic layer is annealed to induce a crystallographic ordering of the cobalt-platinum magnetic layer from a disordered phase to an ordered equilibrium phase; and the diffusion barrier inhibits a reaction at an interface between the substrate and the seed layer as the cobalt-platinum magnetic layer is annealed to induce the ordered equilibrium phase.

18. The device according to claim 15, wherein the substrate comprises at least one of 100, 110, or 111-oriented single crystal silicon.

19. The device according to claim 15, wherein the substrate comprises at least one of single crystal silicon, silicon compound, polycrystalline silicon, silicon dioxide, silicon carbide, silicon nitride.

20. The device according to claim 15, wherein the substrate comprises at least one of germanium, gallium arsenide, quartz, or ceramic compound.

* * * * *